United States Patent [19]
Ahmari et al.

[11] Patent Number: 6,103,614
[45] Date of Patent: Aug. 15, 2000

[54] HYDROGEN AMBIENT PROCESS FOR LOW CONTACT RESISTIVITY PDGE CONTACTS TO III-V MATERIALS

[75] Inventors: David A. Ahmari; Michael L. Hattendorf, both of Champaign; David F. Lemmerhirt, Sugar Grove; Gregory E. Stillman, Urbana, all of Ill.

[73] Assignee: The Board of Trustees of the University of Illinois, Urbana, Ill.

[21] Appl. No.: 09/145,634

[22] Filed: Sep. 2, 1998

[51] Int. Cl.[7] .................... H01L 21/28; H01L 21/3202
[52] U.S. Cl. ................................. 438/606; 438/602
[58] Field of Search .................... 438/57, 558, 565, 438/569, 604, 606

[56] References Cited

U.S. PATENT DOCUMENTS

| | | |
|---|---|---|
| 4,732,821 | 3/1988 | Hauser et al. . |
| 4,892,843 | 1/1990 | Schmitz et al. . |
| 5,520,753 | 5/1996 | Hunter . |
| 5,668,301 | 9/1997 | Hunter . |

OTHER PUBLICATIONS

D. Ahmari et al., "PdGe on GaAs: a study of the applicibility in InGaP/GaAs HbT fabrication", Proceedings of 1997 International Symposium on Compound Semiconductors (no minth given).

D. Ahmari et al., "Effects of alloy ambient on PdGe contacts on n–type GaAs", Applied Physics Letters, vol. 72, No. 26, pp. 3479–3481, Jun. 1998.

D.A. Ahmari, M.L. Hattendorf, D.F. Lemmerhirt, Q. Yang, Q.J. Hartmann, G.E. Stillman, Abstract entitled "PdGe on GaAs: A Study of the Applicability in InGaPIGaAs HBT Fabrication", abstract booklet for the 1997 International Symposium on Compound Semiconductors, published Sep. 8, 1997.

D.A. Ahmari, M.L. Hattendorf, D.F. Lemmerhirt, Q.Yang, Q.J. Hartmann, G.E. Stillman, "PdGe on GaAs: A Study of the Applicability in InGaP/GaAs HBT Fabrication", published in the proceedings subsequent to the 1997 International Symposium on Compound Semiconductors, Sep. 8, 1997.

Yung–Hui Yeh, Jiun–Tsuen Lai, Joseph Ya–Min Lee, "Low Contact–Resistance and Shallow Pd/Ge Ohmic Contacts to n–$In_{0.53}Ga_{0.47}As$ on InP Substrate Formed by Rapid Thermal Annealing", *Jpn. J. Appl. Phys,* vol. 35 (1996) Pt. 2, No. 12A, pp. 1569–1571.

Jiun–Tsuen Lai, Joseph Ya–Min Lee, "Pd/Ge Ohmic Contacts to n–Type GaAs Formed by Rapid Thermal Annealing", *Appl. Phys. Lett.,* vol. 64, No. 1, Jan. 10, 1994, pp. 229–231.

E.D. Marshall, B. Zhang, L.C. Wang, P.F. Jiao, W.X. Chen, T. Sawada, S.S. Lau, "Nonalloyed Ohmic Contacts to n–GaAs by Solid–Phase Epitaxy of Ge", *J. Appl. Phys.,* vol. 62, No. 3, Aug. 1, 1987, pp. 942–947.

Jiun Tsuen Lai, Joseph Ya–Min Lee, "Redistribution of Constituent Elements in Pd/Ge Contacts to n–Type GaAs Using Rapid Thermal Annealing", *J. Appl. Phys.,* vol. 76, No. 3, Aug. 1, 1994, pp. 1686–1690.

(List continued on next page.)

*Primary Examiner*—John F. Niebling
*Assistant Examiner*—Keith Christianson
*Attorney, Agent, or Firm*—Greer, Burns & Crain, Ltd.

[57] ABSTRACT

The invention uses hydrogen ambient atmosphere to directly form PdGe contacts on Group III–V materials. Specific GaAs HBT's have been formed in a 100% $H_2$ ambient, and demonstrate low etch reactivity attributable to the significant incorporation of hydrogen. The LP-MOCVD method used to demonstrate the invention produced a specific contact resistivity of less than $1 \times 10^{-7}$ $\Omega$-$cm^{-2}$, at preferred conditions of a 100% hydrogen ambient, 300° C., and 15 minute reaction time. This is believed to be the lowest known resistance of any alloy method employed for PdGe on GaAs. Equally significant, the contacts demonstrate increased durability during etching.

7 Claims, 9 Drawing Sheets

OTHER PUBLICATIONS

W.Y. Han, Y. Lu, H.S. Lee, M.W. Cole, L.M. Casas, A. DeAnni, K.A. Jones, L.W. Yang, "Shallow Ohmic Contact to Both n–and p–GaAs", *J. Appl. Phys.*, vol. 74, No. 1, Jul. 1, 1993, pp. 754–756.

L.C. Wang, X.Z. Wang, S.N. Hsu, S.S. Lau, P.S.D. Lin, T. Sands, S.A. Schwartz, D.L. Plumton, T.F. Keuch, "An Investigation of the Pd–In–Ge Nonspiking Ohmic Contact to n–GaAs Using Transmission Line Measurement, Kelvin, and Cox and Strack Structures", *J. Appl. Phys.*, vol. 69, No. 8, Apr. 15, 1991, pp. 4364–4372.

D. B. Slater, Jr., P. M. Enquist, J.A. Hutchby, A.S. Morris, R.J. Trew, "Low Emitter Resistance GaAs Based HBT's Without InGaAs Caps", *IEEE Electron Device Letters*, vol. 15, No. 5, May 1994.

I.–H. Kim, S.H. Park, T.–W. Lee, M.P. Park, B.R. Ryum, K.E. Pyun, H.–M. Park, "Pd/Ge–Based Ohmic Contacts to n–GaAs and n–GaAs for Heterojunction Bipolar Transistors", presented at ISCS conference, Sep. 8–11, 1997.

E.D. Marshall, L.S. Yu, S.S. Lau, T.F. Kuech, K.L. Kavanagh, "Planar Ge/Pd and Alloyed Au–Ge–Ni Ohmic Contacts to n–$Al_xGa_{1-x}As$ (0<x<0.3)", *Applied Physics Letters*, vol. 54, No. 8, 1989, pp. 72–73.

S. Umemura, K. Yasuda, T. Aoki, "Contact Resistance Characteristics of Noble Metal Alloys for Connector Contacts", *IEEE Trans. Compon. Hybrids Manuf. Technol.*, vol. 14, No. 1, Mar. 1991, pp. 181–186.

S. Asmontas, A. Suziedelis, "Small Area Contacts of Different Metals with p–type Germanium", *Semiconductors*, vol. 30, No. 7, Jul. 1996, pp. 614–617.

J. Brown, J. Ramer, K. Zheng, L.F. Lester, S.D. Hersee, J. Zolper, "Ohmic Contacts to Si–Implanted and Un–Implanted n–type GaN", Materials Research Society Symposium Proceedings, vol. 395, presented at the First International Symposium on Gallium Nitride and Related Materials, Boston, MA, Nov. 27–Dec. 1, 1995, pp. 855–860.

K.A. Jones, M. Dubey, W.Y. Han, M.W. Cole, D.W. Eckart, "Novel Ohmic Contacts to III–V Semiconductors", Proceedings of the Twenty–Fourth State–Of–The–Art Program on Compound Semiconductors, Los Angeles, CA, May 5–10, 1996, pp. 181–185.

Yi–Tae Kim, John–Lam Lee, Jae Kyoung Mun, Haecheon Kim, "Pd/Ge/Ti/Au Ohmic Contact to AlGaAs/InGaAs Pseudomorphic High Electron Mobility Transistor with an Undoped Cap Layer", *Appl. Phys. Lett*, vol. 71, No. 18, Nov. 3, 1997, pp. 2656–2658.

F. Edelman, R. Brener, C. Cytermann, M. Eizenberg, R. Weil, W. Beyer, "Reduction of $SnO_2$ BY a–$Si_{1-x}Ge_x$", Materials Research Society Symposium Proceedings, vol. 337, presented at Advanced Metallization for Devices and Circuits—Science, Technology and Manufacturability Symposium, San Francisco, CA, Apr. 1994, pp. 589–594.

R.C. Hughes, P.A. Taylor, A.J. Ricco, R.R. Rye, "Kinetics of Hydrogen Adsorption and Absorption: Catalytic Gate MIS Gas Sensors on Silicon", *J. Electrochem. Soc.*, vol. 136, No. 9, Sep. 1989, pp. 2653–2661.

A. Dutta, S. Basu, "Modified Metal–Insulator–Metal (M–I–M) Hydrogen Gas Sensors Based on Zinc Oxide", *J. Mater. Sci., Mater. Electron.*, vol. 6, No. 6, dec. 1995, pp. 415–418.

G. Morrison, "After 40 Years SiGe's Time Has Finally Come", *Electronic News*, vol. 44, No. 2205, Feb. 9, 1998.

D.A. Ahmari, M.L. Hattendorf, D.F. Lemmerhirt, Q. Yang, Q.J. Hartmann, J.E. Baker and G.E. Stillman, "Effects of Alloy Ambient on PdGe Contacts on n–Type GaAs", *Applied Physics Letters*, vol. 72, No. 26, Jun. 29, 1998, pp. 3479–3481.

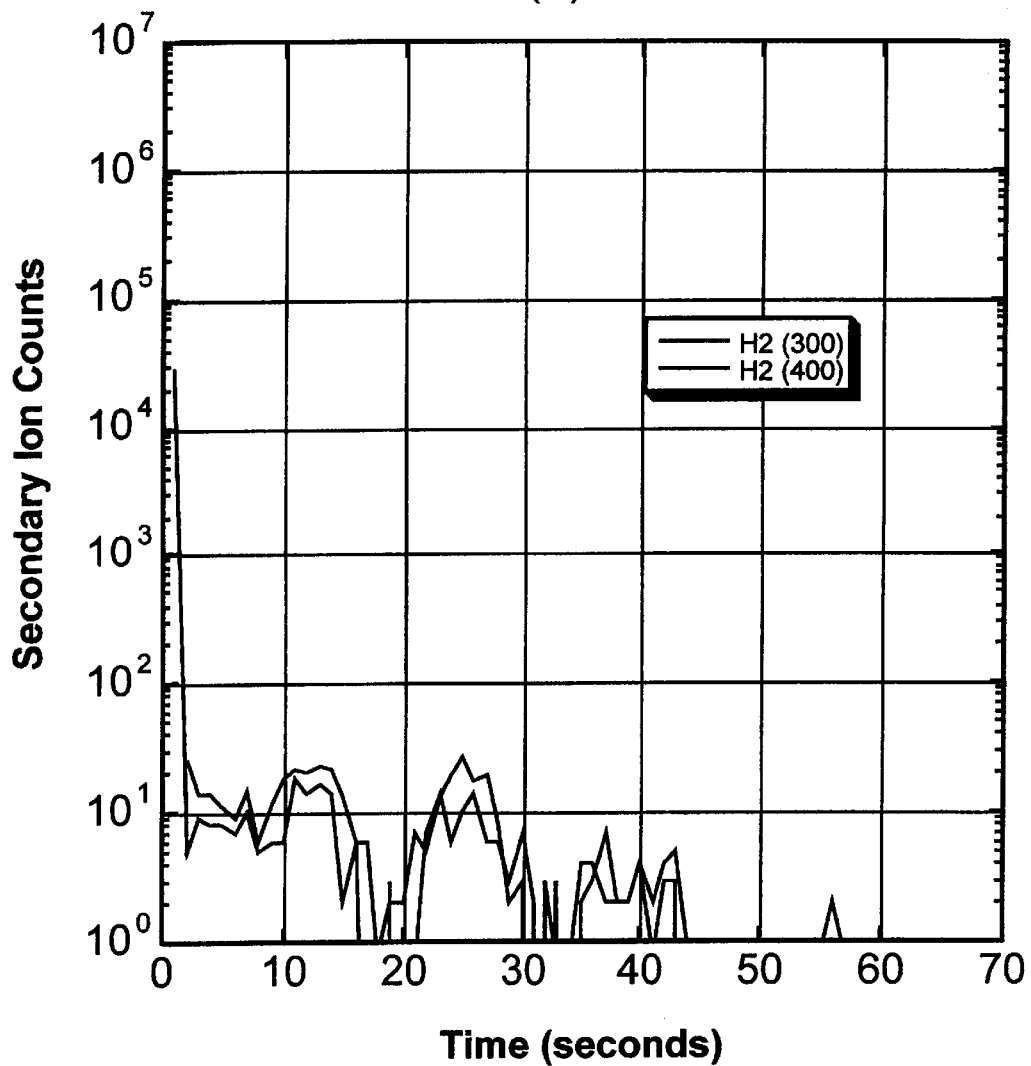

HYDROGEN AMBIENT PROCESS FOR LOW CONTACT RESISTIVITY PDGE CONTACTS TO III-V MATERIALS

This invention was made with Government support under ARPA Contract No. N66001-96-C-8615 awarded by the Office of Naval Research. The Government has certain rights in the invention.

FIELD OF THE INVENTION

The present invention relates generally to electrical contacts formed on Group III–V materials. The invention specifically concerns a method for producing low resistivity PdGe contacts.

BACKGROUND OF THE INVENTION

Group III–V semiconductor devices are of wide interest and application. These devices have many advantages over silicon based semiconductors, including speed and an ability to produces optical emissions. They are widely used in optoelectronic devices. One problem common to Group III–V devices relates to the electrical contact metallizations used to form interconnects between discrete devices. Resistivity is obviously an issue, since lower contact resistivities lower power consumption and decrease heat generation. Bonding is also an issue, since failure to form a reliable bond with the III–V material will result in devices prone to poor operation and short life span.

A particular example is the prior use of AuGeNiAu as an emitter contacting layer on the GaAs emitter caps of GaAs heterojunction bipolar transistors (HBTs). Experience has shown these contacts to be unreliable due to Au spiking and balling. Au rapidly diffuses into GaAs and nonplanar surface morphologies often result. These problems became more prominent as feature size was reduced. These problems led to modem conventional HBTs, which typically employ a non-alloyed TiPtAu emitter contact on a strained InGaAs contacting layer to eliminate the possibility of spiking. Fabrication is rendered difficult, however. Strained InGaAs causes difficulty during crystal growth and during a self-aligned wet chemical etch.

Others have investigated the use of PdGe contacts to alleviate these and similar problems. For example, Lai et al. have reported PdGe contacts on n-type GaAs and InP by rapid thermal annealing. See, "Pd/Ge ohmic contacts to n-type GaAs formed by rapid thermal annealing", Appl. Phys. Lett. 64 (2), p. 229, Jan. 10, 1994; and "Low Contact-Resistance and Shallow Pd/Ge Ohmic Contacts to n-In$_{0.53}$Ga$_{0.47}$As on InP Substrate Formed by Rapid Thermal Annealing", Jpn. J. App. Phys. Vol. 35 (1996) Pt. 2, No. 12A, p. 1569. Additional work has been done by Marshall et al., "Nonalloyed ohmic contacts to n-GaAs by solid-phase epitaxy of Ge", J. Appl. Phys. 62 (3), p. 942 (Aug. 1, 1987). Good resistivities were obtained by these and other previous works. Contacts according to many of the published works are revealed to be highly reactive, though, indicating poor suitability for manufactured devices. In addition, though the most commonly reported resistivities of $10^{-5}$–$10^{-6}\Omega$-cm$^2$ are ohmic, even lower resistivities are always better.

Accordingly, there is a need for an improved method for forming PdGe contacts on Group III–V layers. There is a further need for an improved method for forming PdGe contacts on Group III–V layers that lowers the etch reactivity of the contacts, provides good resistivity, and avoids manufacturing difficulties such as strained intermediate layers. There is an additional need for an improved PdGe-Group III–V direct interface.

SUMMARY OF THE INVENTION

These and other needs are met or exceeded by the present hydrogen ambient method for low resistivity PdGe contacts to Group III–V layers. The invention uses hydrogen ambient atmosphere to directly form PdGe contacts on Group III–V materials. Specific GaAs HBT's have been formed in a 100% H$_2$ ambient, and demonstrate low etch reactivity attributable to the significant incorporation of hydrogen. The alloy LP-MOCVD method used to demonstrate the invention produced a specific contact resistivity of less than $1\times 10^{-7}$ $\Omega$-cm$^{-2}$, at preferred conditions of a 100% hydrogen ambient, 300° C., and 15 minute reaction time. This is believed to be the lowest known resistance of any alloy method employed for PdGe on GaAs. Equally significant, the contacts demonstrate increased durability during etching.

BRIEF DESCRIPTION OF THE DRAWINGS

Other objects, features and advantages of the present invention will become apparent upon reading the following detailed description, while referring to the attached drawings, in which:

FIGS. 7(a) and 7(b) are plots of variation in hydrogen SIMS count versus sputtering time at different alloy temperatures for (a) nonalloyed and hydrogen ambient samples and (b) nitrogen alloy ambient samples.

DETAILED DESCRIPTION OF THE INVENTION

The present invention provides a method for low contact resistivity PdGe contacts on Group III–V layers. Contacts are formed in hydrogen ambient, and result in low contact resistance and increased etching durability. Though the invention is demonstrated with respect to a particular PdGe to GaAs emitter cap HBT, the known similar behavior between PdGe and other Group III–V materials, such as Al$_x$Ga$_{1-x}$As, In$_x$Ga$_{1-x}$As, GaP, and In$_x$Ga$_{1-x}$P, (for x between 0 and 1), demonstrates the invention's usefulness to PdGe contacts on Group III–V layers in general. Artisans will appreciate this general applicability beyond the specific GaAs layers used to demonstrate the invention.

According to the invention, low resistivity PdGe contacts with high etch resistance are produced when an alloy is performed in a high concentration H$_2$ ambient. The alloy is performed with a high purity hydrogen source at alloy temperatures exceeding approximately 300° C. in an enclosed chamber which permits production of hydrogen ambient at elevated temperatures. Preferably, a device is made by alloying a contact for only a short time in $H_2$, or not at all, followed by performing necessary etching and then completing the $H_2$ alloy using a time sufficient to allow the reaction to reach equilibrium.

Figure 1:
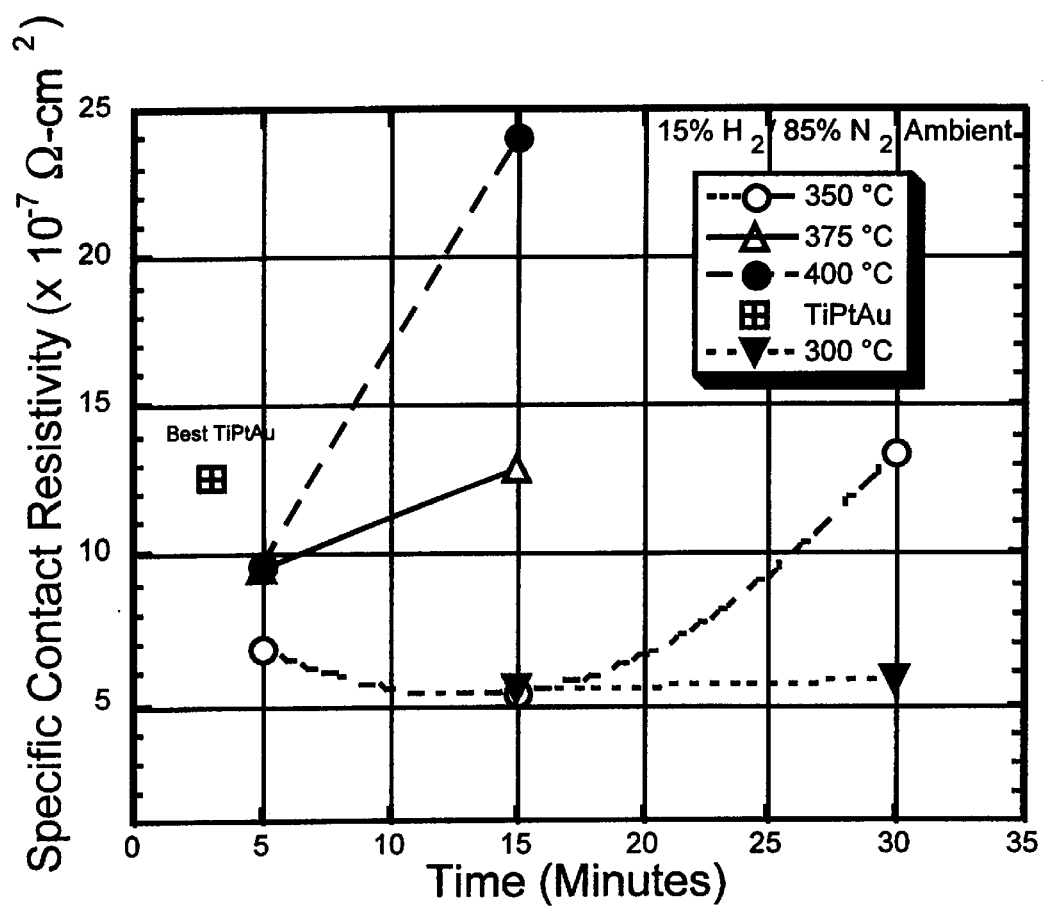
FIG. 1 is a plot of specific contact resistivity versus time at various temperatures for PdGe in a 15% H$_2$/85% N$_2$ alloy and includes results for a TiPtAu standard structure.

Experiments related to development and testing of the invention will now be described to demonstrate its mode of practice and usefulness to those skilled in the art. Referring now to FIG. 1, the effect of time and temperature upon the specific contact resistance for PdGe contacts alloyed in a 15%$H_2$/85%$N_2$ ambient is shown. The contacts were not ohmic after a five minute alloy at 300° C., but after 15 minutes at 300° C. the PdGe alloy was ohmic. The specific contact resistivity did not change significantly after longer alloys at this relatively low alloy temperature. At 350° C., the PdGe formed a low resistivity ohmic contact after both 5 and 15 minute alloys, and rose sharply after a 30 minute alloy. At both 375° C. and 400° C. the contact resistivity rose sharply with time immediately after a five minute alloy.

Figure 2:
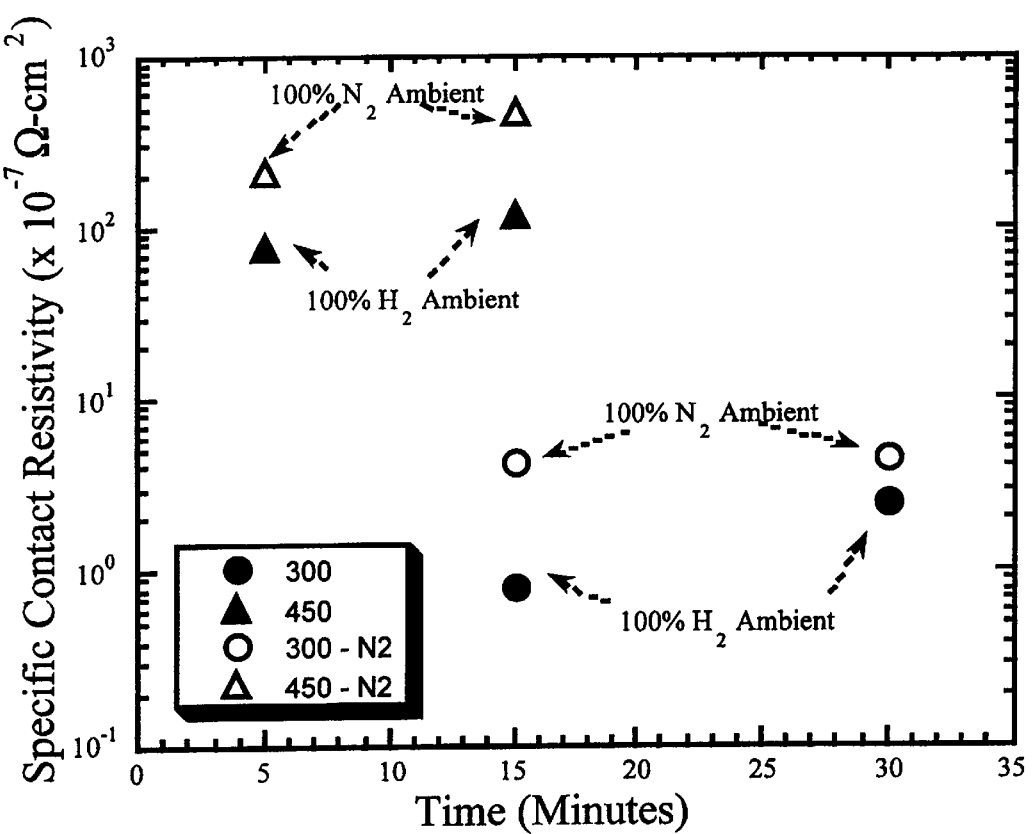
FIG. 2 is a plot of specific contact resistivity versus time for PdGe at various temperatures in N$_2$ and H$_2$ ambients.

FIG. 2 shows the PdGe behavior for alloys in ambients of 100% $H_2$ and 100% $N_2$, and demonstrates the better resistance of the high concentration hydrogen ambient contacts of the invention. The results show that for a given set of alloy conditions the hydrogen ambient always produces the lowest specific contact resistivity. However, the trend of contact resistivity versus time and temperature are similar for each alloy ambient.

A five minute alloy at 300° C. produced nonohmic contacts in any ambient. After ten minutes of alloying, the $N_2$ ambient produced an ohmic contact and the $H_2$ did not. The ten minute $N_2$ alloy had the lowest contact resistance of any of the $N_2$ alloys, and a 15 minute $H_2$ alloy produced the lowest contact resistance for $H_2$. The 15 minute $H_2$ alloy at 300° C. is believed to have produced the lowest reported specific contact resistivity ($\rho_c < 1 \times 10^{-7}$ Ω-cm$^2$) of any alloy methods employed for PdGe on GaAs. The longer alloy times in the $H_2$ ambient suggest that the $H_2$ slows the PdGe reaction.

Another important issue for using a PdGe contact is the reactivity of the contact during an etch. Other experiments were conducted and show that conventional PdGe contacts are very reactive and etched easily in many of the oxidizing agents and acids typically used in GaAs etches, while the contacts formed under high concentration hydrogen ambients of the invention are more durable.

Figure 3A:
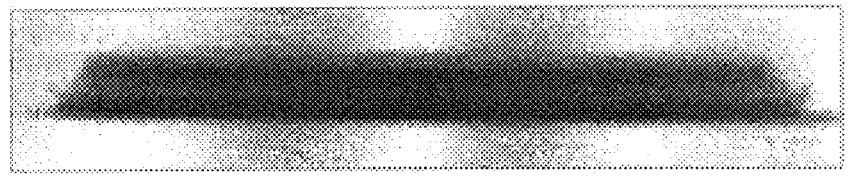
FIGS. 3(a)–3(c) are images of various PdGe HBT emitters after a self-aligned etching.
Figure 3B:
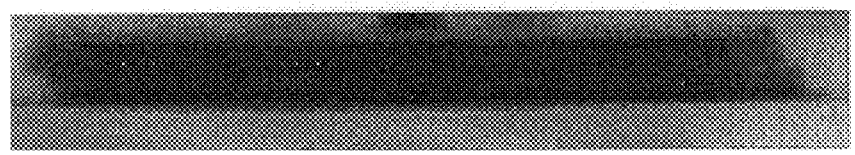
Figure 3C:
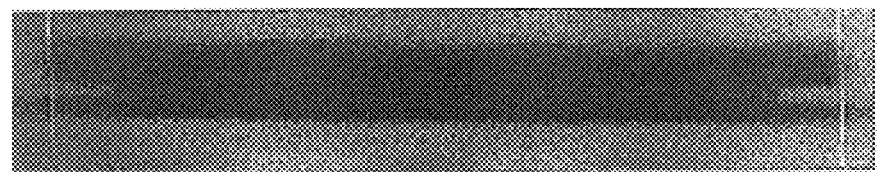
Figure 4:
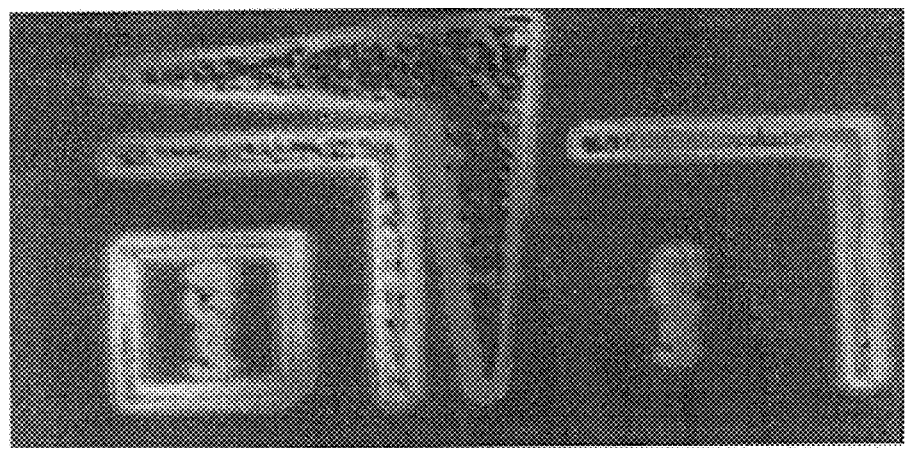
FIG. 4 is an image of a PdGe (10 minute, H$_2$ ambient) alignment mark after a self-aligned emitter etching.

This principle was proven by experimenting with an InGaP/GaAs HBT fabrication process. All of the HBT emitters that were alloyed in 100% nitrogen were highly reactive and were removed by the emitter etch. However, PdGe emitter contacts alloyed in hydrogen remained after the emitter etch and are shown in FIG. 3. As seen in FIG. 3(a), an unalloyed sample withstood the etch, but displayed a nonideal self-aligned etch profile. After a two minute $H_2$ alloy, the emitters displayed excellent undercut characteristics, which are shown in FIG. 3(b). After six minutes, the contacts became more reactive and the etch profiles were observed to be inconsistent across the sample. One such emitter contact that showed an inconsistent etch profile on opposite sides of the same device is shown in FIG. 3(c). After a ten minute alloy, the emitters were all removed as shown in FIG. 4, where large PdGe alignment marks have almost been completely removed. When fabricating HBTs that employ a PdGe contact, one must therefore either use dry etching or optimize the alloy conditions to decrease the reactivity of PdGe with various etchings.

Thus, the PdGe contacts should be useful in semiconductor device circuit applications due to their reduced reactivity.

The ambient alloy conditions were shown to significantly affect the alloy behavior during formation and after exposure to GaAs etchings. The $H_2$ ambient slows the PdGe alloy formation. This allows PdGe contacts to reach lower contact resistivities and better strength/resilience in etchings. To produce durable contacts one would not alloy or perform a very short alloy in hydrogen before any etching. Then after etching, the rest of the alloy should be performed.

Figure 5A:
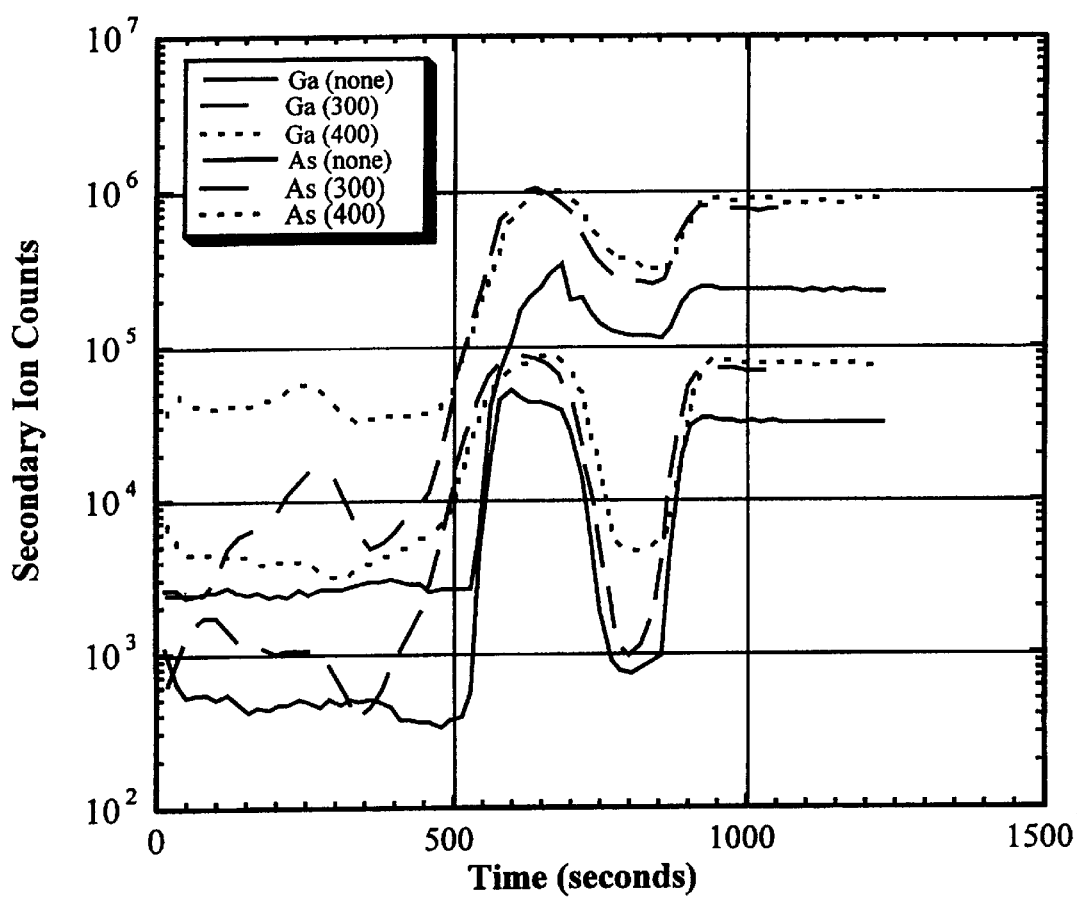
FIGS. 5(a) and 5(b) are plots of variation in Ga and As SIMS counts versus sputtering time at different alloy temperatures for: (a) nonalloyed and hydrogen ambient samples and (b) nitrogen alloy ambient samples.
Figure 5B:
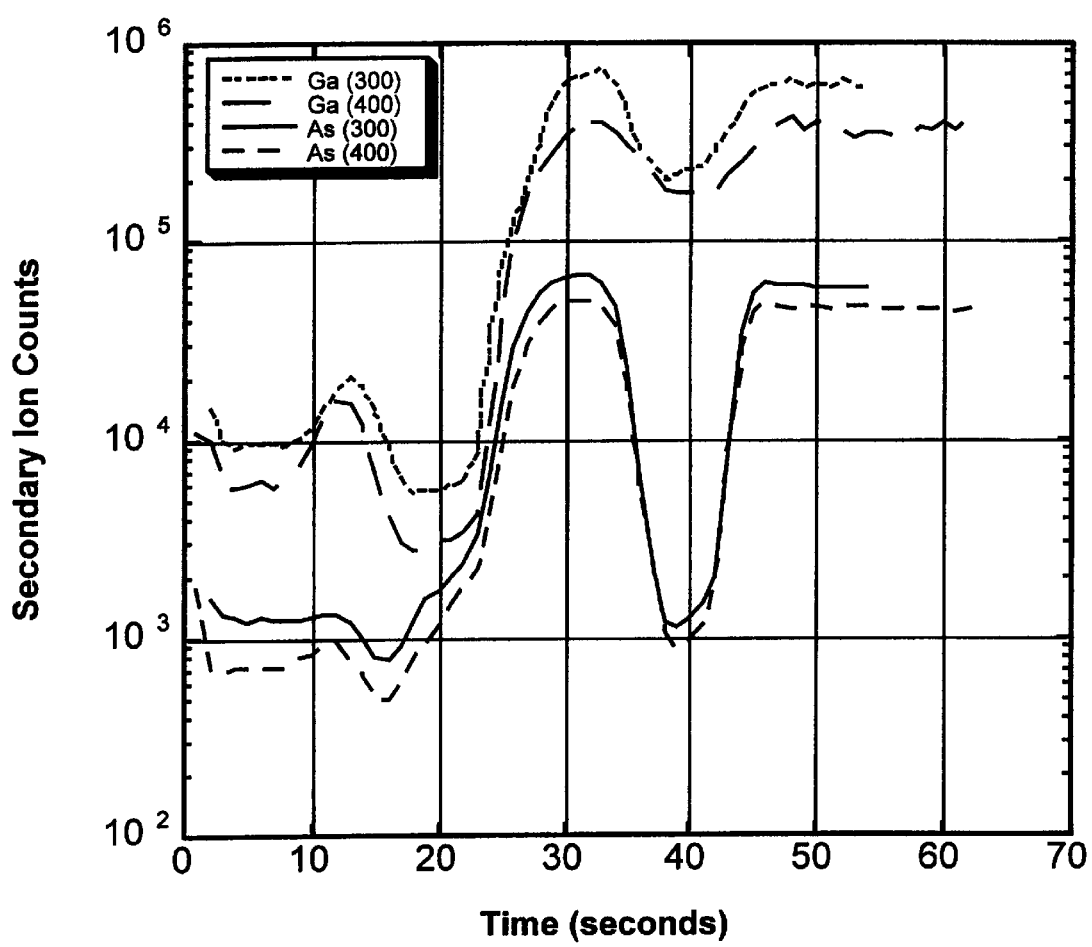

To show that the hydrogen ambient does affect the formation of a PdGe alloy, experiments were run to collect SIMS data. These data shows that the $H_2$ does slow the alloy reaction that occurs during the heat treatment. FIGS. 5(a) and (b) show SIMS data for Gallium and Arsenide in Hydrogen and Nitrogen alloy ambients, respectively. The data for a nonalloyed contact are also shown. These data show that after a 15 minute $N_2$ alloy at 300° C., there is little further effect on the GaAs concentration in the sample. However, the $H_2$ sample shows that less dispersion and movement of the GaAs occurs during the same alloys, but in hydrogen ambient. Thus, a change is noticed in the Ga and As concentrations below 500 seconds.

Figure 6A:
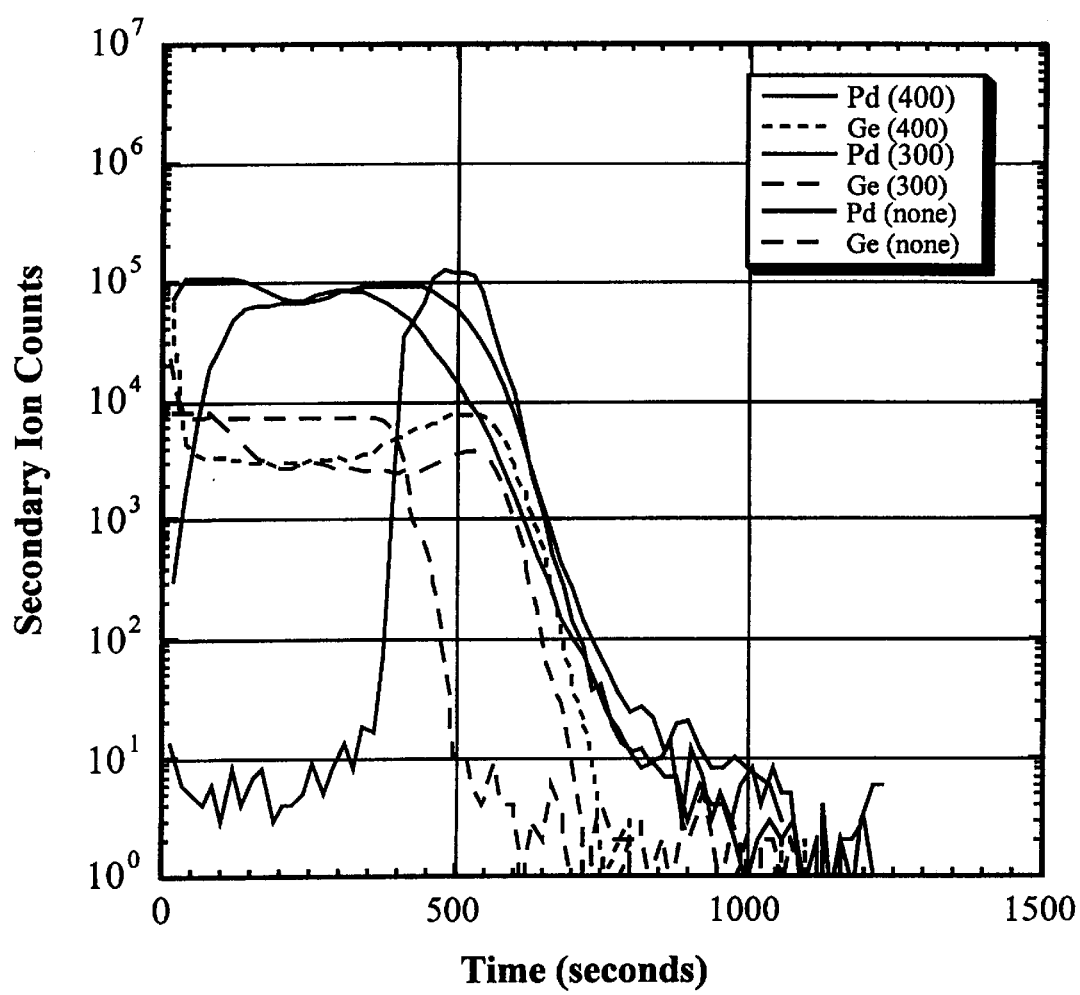
FIGS. 6(a) and 6(b) are plots of variation in Pd and Ge SIMS counts versus sputtering time at different alloy temperatures for (a) nonalloyed and hydrogen ambient samples and (b) nitrogen ambient samples.
Figure 6B:
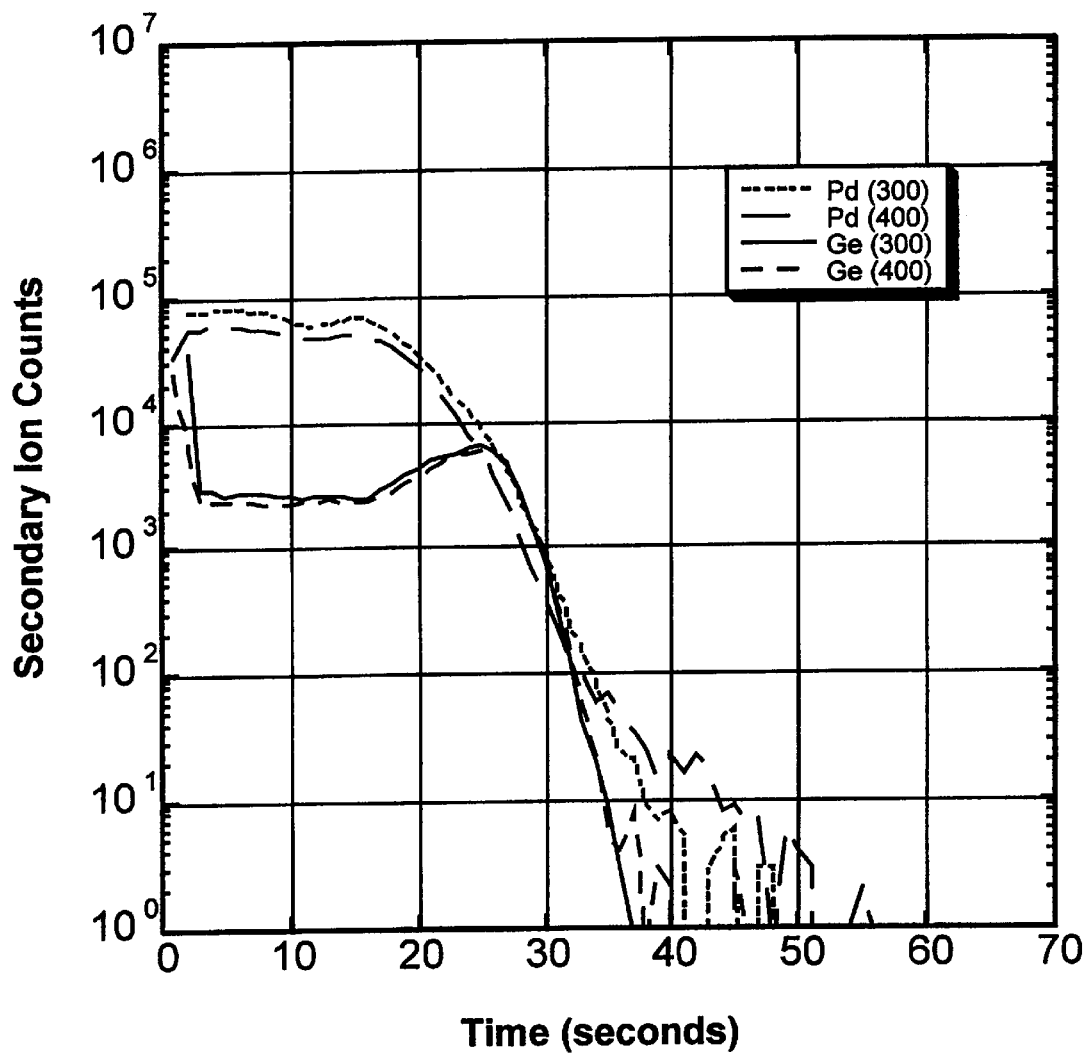

A better understanding of the differences in reactivity versus alloy ambient can be gained when studying the variations in Pd and Ge concentrations versus alloy ambient and temperature. FIGS. 6(a) and (b) show the Pd and Ge secondary ion counts versus sputtering time for hydrogen and nitrogen alloy ambients, respectively. Data from a nonalloyed sample are also present. The data for the hydrogen ambient shows that after any alloying above 300° C., the Ge moves into the sample and displaces the Pd. This reaction continued further when the sample was alloyed at a higher temperature. This data shows the formation of the regrown Ge layer at the GaAs surface as well as a polycrystalline PdGe formation at the "top" of the contact. When looking at the same data, but for a $N_2$ alloy ambient, it becomes apparent that the reaction completely finished after only a 15 minute alloy at 300° C. By comparing the data, it is also clear that in order to get to the complete reaction point, a hydrogen alloy ambient requires more than a 300° C. alloy temperature.

Figure 7A:
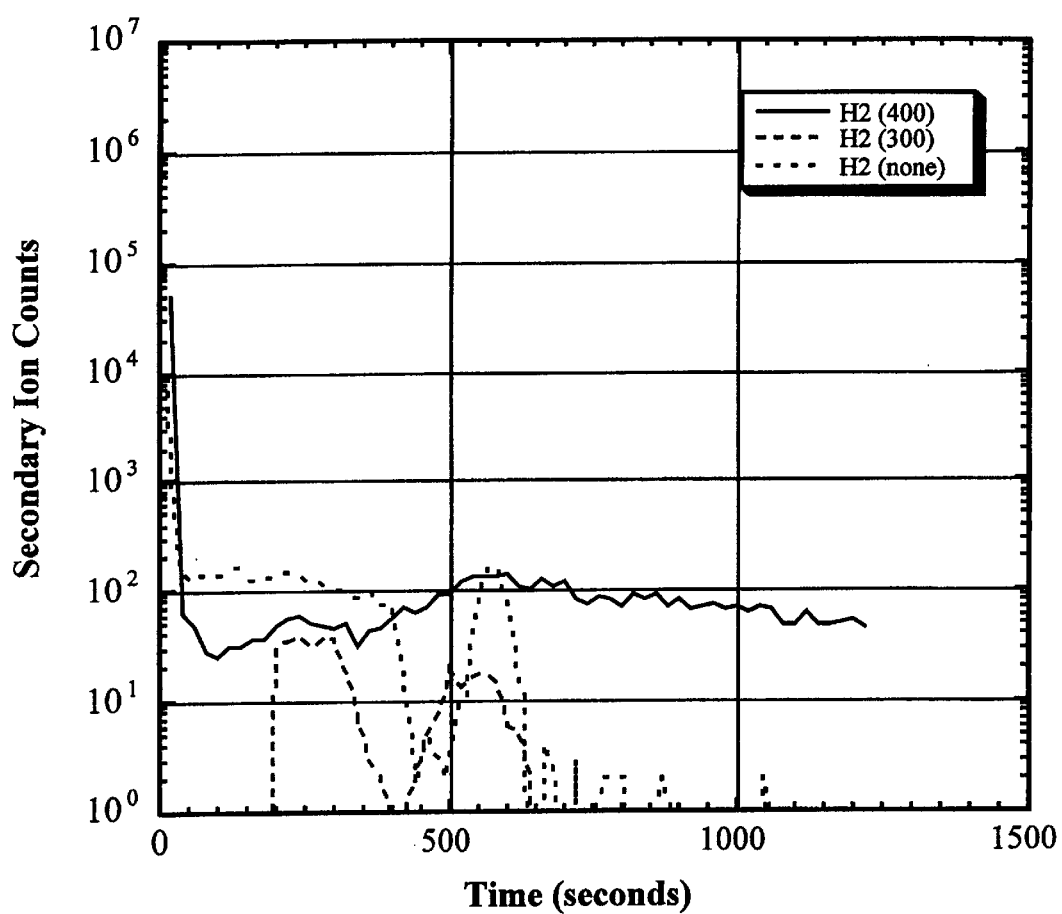

Finally, the hydrogen concentration was observed in each sample under the same conditions described earlier. FIGS. 7(a) and (b) show that the hydrogen concentration in the sample increases as there is more exposure to a hydrogen ambient. The nonalloyed and $N_2$ alloyed samples show very little hydrogen, whereas the 300° C. hydrogen alloy begins to show increases in hydrogen concentration and the 400° C. sample shows a relatively high level of hydrogen throughout the sample.

The contact resistance of PdGe to GaAs must be minimized in order to produce electrical devices with low resistance contacts, and hence better dc and high frequency characteristics. Using the 100% $H_2$ ambient reduces the contact resistance beyond that for a given alloy in any other ambient containing nitrogen and hydrogen. The hydrogen changes the alloy reaction in such a way that the reduction is slow.

The etch reactivity of PdGe is also important for practical use in electrical devices such as heterojunction bipolar transistors, HBTs, light-emitting diodes, LEDs, and field-effect transistors, FETs. When all of the standard alloys are used with PdGe contacts, the contacts are very reactive and cannot be used in a manufacturing environment. For example, when using a self-aligned wet chemical HBT emitter etch, the PdGe contacts can be exposed to various GaAs etchings. Unless large percentages of hydrogen are used during the alloy, the contacts will be removed during the etch. The $H_2$ ambient makes the PdGe based contacts much more durable when immersed in an etchant and thus alloys the PdGe contacts to be a more manufacturable technology. The current lack of a PdGe based ohmic contact that is not highly reactive is currently a major limitation to the implementation of PdGe based contacts in semiconductor device applications.

It is important to note that this alloy method should apply to any material system that allows the PdGe reaction with semiconductor to occur. This applies to $Al_xGa_{1-x}As$, $In_xGa_{1-x}As$, GaP, $In_xGa_{1-x}P$, and any other compound semiconductor that employs group III and group V elements.

In summary, the present method of producing low-resistance, high durability contacts is very feasible. It requires no extra steps in a device fabrication sequence, improves device characteristics, and will allow a more reliable contact scheme to be useful and manufacturable. All that is needed is an alloying station that can produce a hydrogen ambient.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for producing a PdGe contact on a Group III–V layer, comprising steps of:

creating an approximately 100% hydrogen ambient atmosphere; and forming the PdGe contact on the Group III–V layer.

2. The method according to claim 1, wherein said step of forming is conducted for a time between approximately 5 and 30 minutes at a temperature between approximately 300 and 375° C.

3. The method according to claim 2, wherein said step of forming is conducted for approximately 15 minutes at a temperature of approximately 300° C.

4. The method according to claim 2, wherein the Group III–V layer is GaAs.

5. The method according to claim 1, wherein said step of forming is conducted for a time between approximately 5 and 30 minutes at a temperature between approximately 300 and 400° C.

6. The method according to claim 2, wherein said step of forming is conducted for approximately 15 minutes at a temperature of approximately 300° C.

7. The method according to claim 1, wherein said step of forming is partially completed prior to an additional step of etching, and then said step of forming is completed over a time period sufficient to achieve reaction equilibrium.

* * * * *

UNITED STATES PATENT AND TRADEMARK OFFICE
CERTIFICATE OF CORRECTION

PATENT NO. : 6,103,614
DATED : August 15, 2000
INVENTOR(S) : Ahmari et al.

It is certified that error appears in the above-identified patent and that said Letters Patent is hereby corrected as shown below:

On the title page, and Column 1

Under "[54]", line 1, please delete "PROCESS" and insert --METHOD-- therefor

Column 3, line 44, please delete "contacts formed under"

Signed and Sealed this

First Day of May, 2001

Attest:

NICHOLAS P. GODICI

Attesting Officer

Acting Director of the United States Patent and Trademark Office